United States Patent
Aoki et al.

(10) Patent No.: US 10,748,822 B2
(45) Date of Patent: Aug. 18, 2020

(54) METHOD FOR MANUFACTURING SEMICONDUCTOR DEVICE

(71) Applicant: DENSO CORPORATION, Kariya, Aichi-pref. (JP)

(72) Inventors: Takaaki Aoki, Kariya (JP); Masakazu Itoh, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/507,132

(22) Filed: Jul. 10, 2019

(65) Prior Publication Data
US 2019/0333827 A1    Oct. 31, 2019

Related U.S. Application Data

(63) Continuation of application No. PCT/JP2018/002277, filed on Jan. 25, 2018.

(30) Foreign Application Priority Data

Jan. 25, 2017   (JP) ................ 2017-011592

(51) Int. Cl.
| | |
|---|---|
| *H01L 21/66* | (2006.01) |
| *G01R 31/01* | (2020.01) |
| *G01R 31/26* | (2020.01) |
| *H01L 29/10* | (2006.01) |
| *H01L 29/423* | (2006.01) |
| *H01L 29/66* | (2006.01) |
| *H01L 29/739* | (2006.01) |

(52) U.S. Cl.
CPC ............. *H01L 22/20* (2013.01); *G01R 31/01* (2013.01); *G01R 31/2619* (2013.01); *H01L 29/1095* (2013.01); *H01L 29/4236* (2013.01); *H01L 29/66348* (2013.01); *H01L 29/7397* (2013.01)

(58) Field of Classification Search
CPC . H01L 22/20; H01L 29/1095; H01L 29/4236; H01L 29/66348; H01L 29/7397
See application file for complete search history.

(56) References Cited

U.S. PATENT DOCUMENTS

2015/0115314 A1*   4/2015   Arakawa ............. H01L 29/7397
                                                          257/139

FOREIGN PATENT DOCUMENTS

| JP | 2009-069058 A | 4/2009 |
|---|---|---|
| JP | 2009-147015 A | 7/2009 |

* cited by examiner

*Primary Examiner* — Armando Rodriguez
(74) *Attorney, Agent, or Firm* — Posz Law Group, PLC

(57) ABSTRACT

A method for manufacturing a semiconductor device having a trench gate structure is provided. In the method, a first voltage-current characteristic indicating a relation between the main current and the gate voltage under a first temperature is measured to calculate a first threshold voltage. A second voltage-current characteristic indicating a relation between the main current and the gate voltage under a second temperature different from the first temperature is measured to calculate a second threshold voltage. It is determined whether the semiconductor device is a non-defective product or a defective product based on whether a difference between the second threshold voltage and the first threshold voltage is larger than a determination threshold value.

7 Claims, 10 Drawing Sheets

METHOD FOR MANUFACTURING SEMICONDUCTOR DEVICE

CROSS REFERENCE TO RELATED APPLICATIONS

The present application is a continuation application of International Patent Application No. PCT/JP2018/002277 filed on Jan. 25, 2018, which designated the U.S. and claims the benefit of priority from Japanese Patent Application No. 2017-11592 filed on Jan. 25, 2017. The entire disclosures of all of the above applications are incorporated herein by reference.

TECHNICAL FIELD

The present disclosure relates to a method for manufacturing a semiconductor device having a trench gate structure.

BACKGROUND

As a conventional power semiconductor device having a trench gate structure, there are a MOSFET and an insulated gate bipolar transistor (hereinafter, referred to as IGBT). An electrical characteristic inspection is performed to a semiconductor device to determine whether the semiconductor device is a non-defective product having a desired characteristic. For example, in the case of the IGBT, a standard value serving as a criterion for determining whether the device has a desired electrical characteristic is set, and a Vg-Ic characteristic indicating a relation between a gate voltage Vg and a collector current Ic when the IGBT is turned on is measured. When the relation indicated by the Vg-Ic characteristic is within a standard value range, it is determined that the device is a non-defective product. When the relation is out of the standard value range, e.g., when the relation falls below the standard value, it is determined that the device is a defective product.

There may be a potentially-defective product, which has a characteristic within the standard value range at the stage of electrical characteristic inspection but would be deteriorated during usage of the product and would have a characteristic out of the standard value range. Such a defective product cannot be specified in the electrical characteristic inspection. In this regard, a new and useful method is desired.

SUMMARY

The present disclosure provides a method for manufacturing a semiconductor device.

In an aspect of the present disclosure, a method for manufacturing a semiconductor device in which application of a gate voltage to a gate electrode causes a main current to flow between a first electrode and a second electrode is provided. The method comprises: measuring a first voltage-current characteristic indicating a relation between the main current and the gate voltage under a first temperature; calculating a first threshold voltage based on the first voltage-current characteristic, wherein the gate voltage when the main current has a predetermined value in a microcurrent region is calculated as the first threshold voltage; measuring a second voltage-current characteristic indicating a relation between the main current and the gate voltage under a second temperature different from the first temperature; calculating a second threshold voltage based on the second voltage-current characteristic, wherein the gate voltage when the main current has a pre-given value in the microcurrent region is calculated as the second threshold voltage; determining that the semiconductor device is a non-defective product when a difference between the second threshold voltage and the first threshold voltage is larger than a determination threshold value; and determining that the semiconductor device is a defective product when the difference is equal to or smaller than the determination threshold value.

BRIEF DESCRIPTION OF DRAWINGS

Objects, features, and advantages of the present disclosure will become more apparent from the following detailed description made with reference to the accompanying drawings. In the drawings.

DETAILED DESCRIPTION

Figure 1:
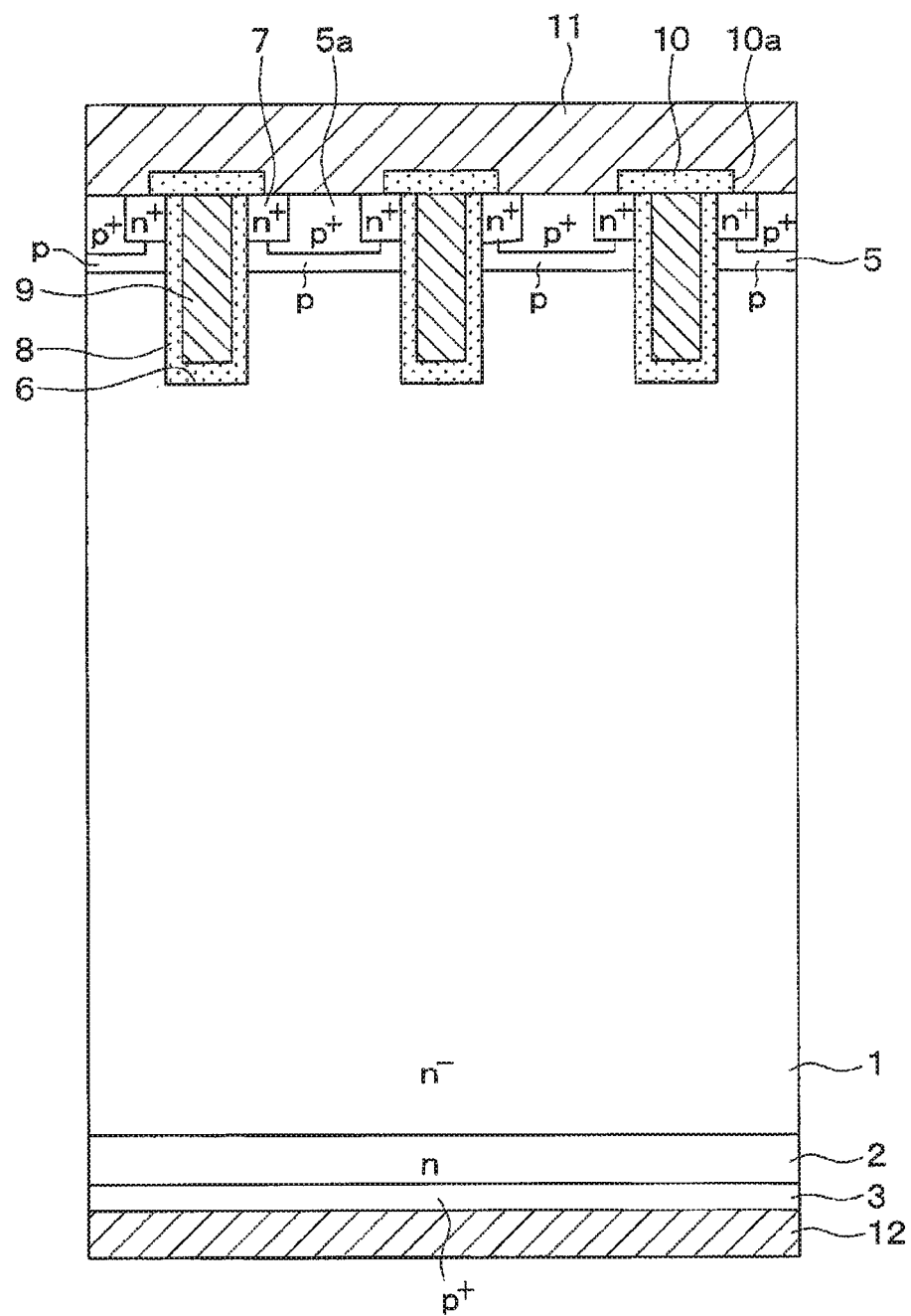
FIG. 1 is a cross sectional view illustrating a structure of a semiconductor device manufactured by a manufacturing method of a first embodiment.

Hereinafter, embodiments of the present disclosure will be described with reference to the drawings. In the below description of respective embodiments, like reference numerals are used to refer to like portions.

First, explanation on a potentially-defective product will be given.

There is a proposed method for improving performance of potentially-defective product detection. In this method, a first test data and a second test data are obtained by performing testing under a first measurement condition and a second measurement condition that are different measurement conditions, and the first data and the second data, respectively, are statistically processed to obtain a first distribution and a second distribution. Then, a relationship between the first distribution and the second distribution is statistically obtained, and it is determined on a product basis whether the product matches a relationship tendency. A product that does not match the relationship tendency is extracted as a specific correlation product, that is, a defective product. In this way, distributions are obtained under different measurement conditions, and, the product out of a distribution tendency is determined as a defective product.

It is found that in this method, it is difficult to accurately detect a defective product that cannot be specified at the time of electrical characteristic inspection.

The inventors of the present disclosure conducted various studies on the above-described potentially-defective product and found that the repeating switching operation of a power semiconductor element having a trench gate structure may shorten the lifetime of a gate insulating film and may lower reliability. For example, in cases where the gate insulating film is formed with a silicon oxide film in a silicon device, when stress around the trench gate structure generated due to a manufacturing process becomes high, an Si—O—Si bond at the boundary between SiO2 and Si is distorted. Specifically, although respective elements are supposed to be bonded at predetermined angles in the Si—O—Si bond, the angles are distorted. The distortion of the Si—O—Si bond causes an increase in interface state, affecting an electrical characteristic. Additionally, a hole may be captured in the interface state, which shortens the lifetime of the gate insulating film.

Furthermore, the stress generated around the trench gate structure due to a manufacturing process tends to be larger as the pitch of trench gates becomes smaller, that is, a mesa width becomes narrower, wherein the mesa width is a width of a portion other than the trenches. In particular, when the mesa width is less than or equal to 1 μm, an influence of the stress becomes prominent, causing a potentially-defective product.

This kind of potentially-defective product, however, cannot be specified in the electrical characteristic inspection. A reason for this will be described.

Figure 3:
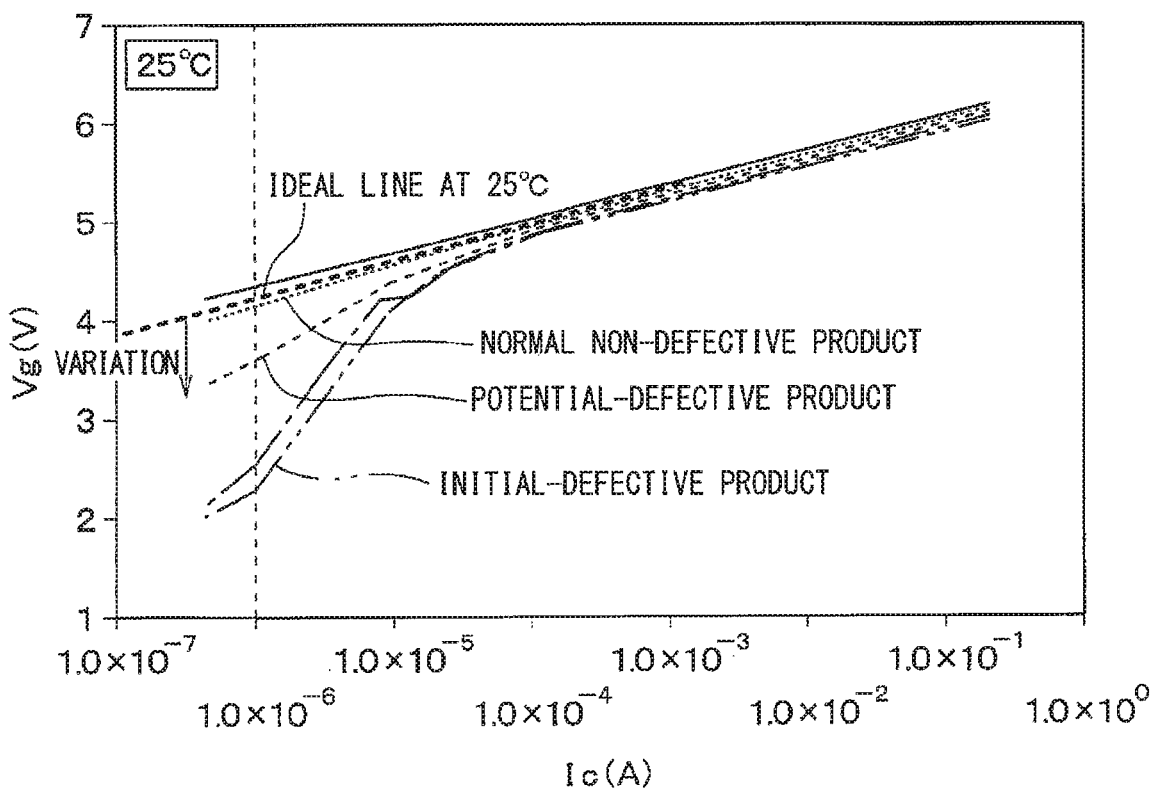
FIG. 3 is a diagram illustrating measurement results of Vg-Ic characteristics at 25 degrees Celsius.

FIG. 3 shows Vg-Ic characteristics of: a non-defective product that is not a potentially-defective product (hereinafter, referred to as normal non-defective product); a potentially-defective product; and an initially-defective product, which is determined as a defective product at the time of the electrical characteristic inspection. As is illustrated in FIG. 3, the value of the gate voltage Vg is considerably small in the initially-defective product as compared with the normal non-defective product in a region where a collector current Ic is low. Accordingly, a standard value may be set to a value lower than a gate voltage Vg anticipated in the normal non-defective product. When the gate voltage Vg is larger than the standard value, it is determined that the device is a normal non-defective product. When the gate voltage Vg is smaller than the standard value, it is determined that the device is an initially-defective product.

As to an initially-defective product, because the gate voltage Vg is below the standard value in the Vg-Ic characteristic, the initially-defective product is determinable as a defective product by the electrical characteristic inspection. Also, when the distribution based relationship is examined, an initially-defective product is out of a relationship tendency that is based on the distribution of the normal non-defective product, the initially-defective product is determinable as a defective product.

As to a potentially-defective product, there is little difference in Vg-Ic characteristic from the normal non-defective product as understood from FIG. 3. Therefore, it is difficult to determine that the potentially-defective product is a defective product on the basis of the standard value. Moreover, even when the distributions are simply examined under different measurement conditions, resultant relationships may be similar between the normal non-defective product and the potentially-defective product, and the potentially-defective product may not be out of the relationship tendency. Therefore, it is difficult to detect a potentially-defective product as the specific correlation product.

In the below, a semiconductor manufacturing method that can properly detect a potentially-defective product and obtain a non-defective product will be described.

First Embodiment

A first embodiment will be described. In the first embodiment, a semiconductor device including an IGBT having a trench gate structure will be described as an example of a semiconductor device manufactured by a manufacturing method.

As illustrated in FIG. 1, the semiconductor device of the present embodiment includes the IGBT as a power semiconductor element. The IGBT is formed in a cell region at a center of a chip (not shown). In the semiconductor device of the present embodiment, an outer peripheral voltage-withstand portion (not shown) is arranged at an outer periphery of the cell region or the like.

The IGBT is formed using a semiconductor substrate. The semiconductor substrate has a first surface serving as a front surface and a second surface serving as a back surface opposite to the front surface. The semiconductor substrate provides an n⁻-type drift layer 1. In the present embodiment, a silicon substrate is used as the semiconductor substrate. A field stop (hereinafter, referred to as FS) layer 2 provided by an n-type layer is formed in a surface layer portion of the n⁻-type drift layer 1 on the back surface side of the n⁻-type drift layer 1. The FS layer 2 is formed on an as-needed basis and is positioned to reach a relatively-shallow predetermined-depth from the back surface of the n⁻-type drift layer 1. The FS layer 2 is provided by ion implantation of n-type impurity such as phosphorus. Impurity concentration and diffusion depth of the FS layer 2 are set depending on required properties of the IGBT and a diode.

On the back surface side of the n⁻-type drift layer 1, a collector region 3 provided by a p⁺-type impurity layer is formed in a surface layer portion of the SF layer 2. The collector region 3 is formed by implantation of p-type impurity such as boron. Impurity concentration and diffusion depth of the collector region 3 are set depending on required properties of the IGBT.

In the above, although the semiconductor substrate provides the n⁻-type drift layer 1 and the FS layer 2 and the collector region 3 are formed by ion implantation, this is merely an example. For example, a p⁺-type substrate providing the collector region 3 may be used as the semiconductor substrate, and the FS layer 2 and the n⁻-type drift layer 1 may be formed on the front surface side of the semiconductor substrate by epitaxial growth or the like.

A p-type region 5 is formed in a front side surface layer portion of the type drift layer 1. A plurality of trenches 6 is formed to penetrate the p-type region 5 and to reach the $n^-$-type drift layer 1. The p-type region 5 is separated into a plurality of regions by the trenches 6. Specifically, the trenches 6 are formed at predetermined pitches. A stripe structure is formed in which the trenches 6 are extended in parallel in a direction perpendicular to the sheet of FIG. 1. Alternatively, an annular structure is formed in which the trenches 6 are extended in parallel in the direction perpendicular to the sheet and are routed at their distal ends.

The p-type region 5 divided into a plurality of regions by the trenches 6 functions as a channel layer in which a channel region is formed. An emitter region 7 provided by an $n^+$-type impurity layer is formed in a surface layer portion of the p-type region 5.

A body p-type region 5a having a high concentration and functioning as a contact portion of the p-type region 5 is formed in a surface layer portion of the p-type region 5. Specifically, the body p-type region 5a is formed between the emitter regions 7 located on both sides in the p-type region 5. In the p-type region 5, the surface concentration of p-type impurity is high.

The emitter region 7 is formed to have a higher impurity concentration than the $n^-$-type drift layer 1. The emitter region 7 is terminated in the p-type region 5 and is arranged to contact with a side surface of the trench 6. To be more specific, the emitter region 7 is extended in a rod manner in the longitudinal direction of the trench 6, and is terminated more inside than a distal end of the trench 6.

The trenches 6 are deeper than the p-type region 5, and are disposed at predetermined pitches in the cross-section illustrated in FIG. 1. Each trench 6 is embedded with: a gate insulating film 8 formed to cover an inner wall surface of the trench 6; and a gate electrode 9 provided by doped Poly-Si or the like formed on a surface of the gate insulating film 8. The gate insulating film 8 is provided by, for example, a silicon oxide film. In cases where the gate insulating film 8 is provided by a silicon oxide film and the semiconductor substrate is provided by a silicon substrate, an Si—O—Si bond is provided on a boundary face between Si on the side surface of the trench 6 and the gate insulating film 8. The gate electrodes 9 are electrically connected with each other at a cross-section other than that in FIG. 1, and are applied with a gate voltage of the same electric potential.

The emitter region 7 and the p-type region 5 are electrically connected to a first electrode 11 serving as an emitter electrode via a contact hole 10a formed in an interlayer insulating film 10. Although not illustrated in the drawings, a passivation film is formed to protect the first electrode 11, a wiring, and the like. A second electrode 12 serving as a collector electrode is formed on the back surface side of the collector region 3. The IGBT is formed in this way.

In the present embodiment, the semiconductor device including the IGBT having the trench gate structure has the above structure. The semiconductor device performs, when an intended gate voltage is applied to the gate electrode 9, switching operation in which a main current flows between the first electrode 11 and the second electrode 12. In the present embodiment, the main current is a collector current Ic.

Next, a method for manufacturing the semiconductor device having the above structure will be described. Among processes of the semiconductor device manufacturing method, the present embodiment employs the same device production processes as those in a conventional method. In the below, an inspection process for non-defective products and defective products will be described mainly.

The inspection process for non-defective products and defective products is performed to the semiconductor device having the above structure by electrical characteristic inspection, as one of manufacturing processes of the semiconductor device. That is, the inspection process is performed by the electrical characteristic inspection to determine whether a semiconductor device has a desired electrical characteristic. When the semiconductor device does not have the desired electrical characteristic, the device is determined as being defective and is excluded from shipment targets. The device having the desired electrical characteristic is to be shipped.

Here, suppose a method that includes setting a standard value for the electrical characteristic inspection, measuring a Vg-Ic characteristic corresponding to a voltage-current characteristic, determining that the device is a non-defective product when a gate voltage required for a certain current amount to flow is greater than or equal to the standard value, and determining that the device is a defective product when the gate voltage is less than the standard value. This method can exclude the initially-defective product which is determinable at the manufacturing stage. However, this method cannot distinguish the normal non-defective product and the potentially-defective product from each other.

Figure 2:
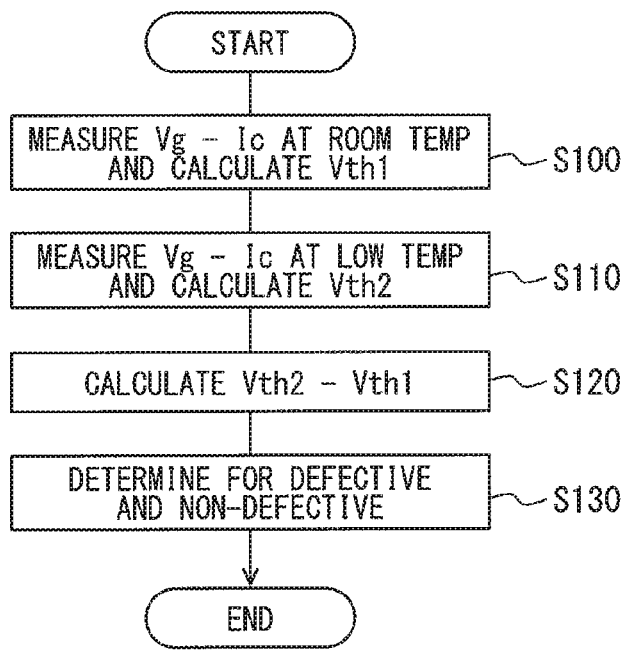
FIG. 2 is a flow chart of an inspection process that is one process of manufacturing processes of a semiconductor device.

Therefore, the present embodiment performs S100 to S130 illustrated in FIG. 2 to exclude a potentially-defective product in addition to an initially-defective product.

First, in S100, the Vg-IC characteristic at, for example, a room temperature serving as a first temperature is measured and the first threshold voltage Vth1 is calculated. Specifically, under the first temperature, a gate voltage Vg is applied to the gate electrode 9, and a relation between the gate voltage Vg and the collector current Ic when the IGBT is turned on is measured. This measurement of the Vg-Ic characteristic is performed to each of a plurality of chips obtained from, for example, a single wafer. Then, in a microcurrent region, e.g., a region where the collector current Ic is less than or equal to 1 µA, the gate voltage Vg when the collector current Ic becomes a predetermined value, e.g., 1 µA is designated the first threshold voltage Vth1. In the above, although the measurement is performed under an environment where the first temperature is the room temperature 25 degrees Celsius, the first temperature is not limited to the room temperature and the room temperature is not limited to 25 degrees Celsius. Note that although a region where the collector current Ic is less than or equal to 1 µA is shown as an example of the microcurrent region, the microcurrent region specifically refers to a region of the current less than or equal to a threshold value of the IGBT.

Next, in S110, the Vg-Ic characteristic under a second temperature lower than the first temperature is measured, and the second threshold voltage Vth2 is calculated. The second temperature is for example a temperature below a freezing point of water and is −40 degrees Celsius in this example. Specifically, under the second temperature, the gate voltage Vg is applied to the gate electrode 9, and a relation between the gate voltage Vg and the collector current Ic when the IGBT is turned on is measured. The measurement of the Vg-Ic characteristic is performed also to, for example, each of a plurality of chips obtained from a single wafer. Then, in the microcurrent region, the gate voltage Vg at which the collector current Ic becomes a pre-given value, e.g., 1 µA, is designated the second threshold voltage Vth2. Although a temperature lower than the first temperature is selected as the second temperature, the second temperature may be any temperature as long as it differs from the first temperature.

In S120, Vth2−Vth1 is calculated, which is the difference between the second threshold voltage Vth2 calculated in S110 and the first threshold voltage Vth1 calculated in S100. In this context, a variation in the value of Vth2−Vth1 occurs between a normal non-defective product; and a potentially-defective product and an initially-defective product. Explanation on the variation will be given with reference to FIG. 3 to FIG. 6.

Figure 4:
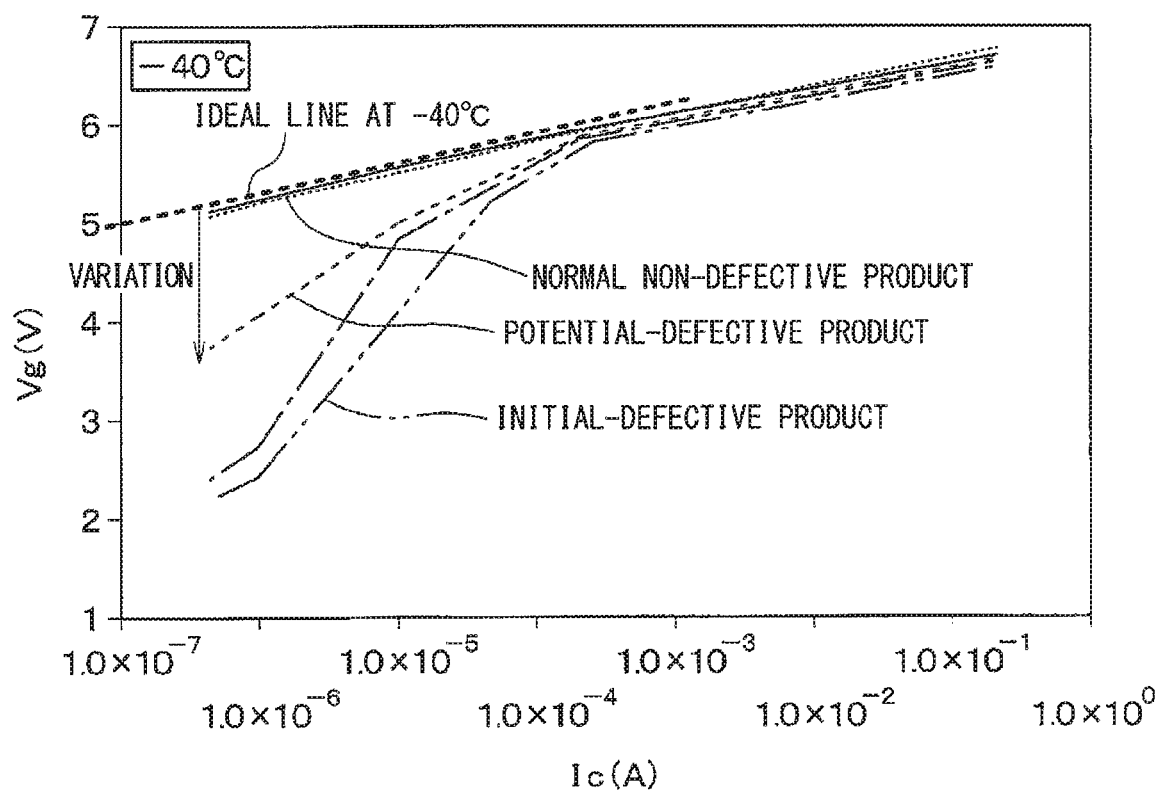
FIG. 4 is a diagram illustrating measurement results of Vg-Ic characteristics at −40 degrees Celsius.

FIG. 3 and FIG. 4 illustrate results of measurements of the Vg-Ic characteristic of a plurality of chips including a normal non-defective product, a potentially-defective product, and an initially-defective product under the room temperature and under the temperature of −40 degrees Celsius. The room temperature is an example of the first temperature and the temperature of −40 degrees Celsius is an example of the second temperature.

In the room temperature, as illustrated in FIG. 3, the Vg-Ic characteristic of a normal non-defective product is expressed such that the collector current Ic and the gate voltage Vg, which are variable, have a uniform relationship and are depicted as a straight line as shown in FIG. 3 by the ideal line. By contrast, the Vg-Ic characteristic of an initially-defective product is expressed such that although the Vg-Ic characteristic is depicted as a straight line like the ideal line in a region where the collector current Ic and the gate voltage Vg are large, the Vg-Ic characteristic is deviated from the ideal line in a region where the collector current Ic and the gate voltage Vg are small. That is, in the initially-defective product, the gate voltages Vg at the small collector current Ic are smaller than in the normal non-defective product. Likewise, in the potentially-defective product, although the Vg-Ic characteristic is depicted as a straight line like the ideal line in a region where the collector current Ic and the gate voltage Vg are large, the gate voltages Vg at the small collector currents Ic are smaller than in the normal non-defective product in the region where the collector current Ic and the gate voltage Vg are small.

In this regard, in the potentially-defective product, a degree of decrease in the gate voltage Vg at the small collector currents Ic is smaller than in the initially-defective product. Specifically, when a comparison is made between the potentially-defective product and the initially-defective product in term of the gate voltage Vg at the same collector current Ic, the gate voltage Vg of the potentially-defective product is larger than that of the initially-defective product and is close to the gate voltage Vg of the normal non-defective product. Accordingly, the above-described standard value to discriminate between characteristic of a normal non-defective product and characteristic of an initially-defective product cannot distinguish the potentially-defective product.

As to the Vg-Ic characteristics obtained at −40 degrees Celsius illustrated in FIG. 4, the Vg-Ic characteristic of each of the normal non-defective product, the potentially-defective product, and the initially-defective product is similar to that at the room temperature illustrated in FIG. 3. In this regard, however, when a comparison is made between the ideal line of the Vg-Ic characteristic at −40 degrees Celsius and the thin broken line indicative of the Vg-Ic characteristic of the normal non-defective product at the room temperature illustrated in FIG. 3, the ideal line of the Vg-Ic characteristic at −40 degrees Celsius shows the gate voltage higher than the thin broken line of FIG. 3 by about 1 V, regardless of the collector current Ic. As to the potentially-defective product and the initially-defective product, the Vg-Ic characteristics of the potentially-defective product and the initially-defective product are overlapping with the ideal line in the region of the high collector current Ic and the high gate voltage Vg, and are deviated from the ideal line in the region of the low collector current Ic and the low gate voltage Vg. At −40 degrees Celsius, the degree of decrease in the gate voltage Vg at the small collector currents Ic is larger than that at the room temperature. Specifically, at −40 degrees Celsius, the gate voltages Vg of the potentially-defective product and the initially-defective product at low collector currents Ic exhibits little change from that at the room temperature.

Figure 5A:
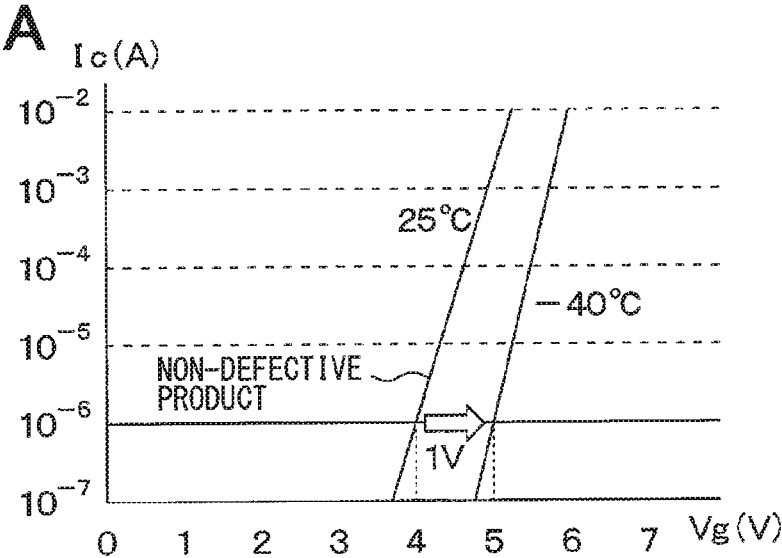
FIG. 5A is a diagram illustrating a change in Vg-Ic characteristic of a normal non-defective product at each of 25 degrees Celsius and −40 degrees Celsius.
Figure 5B:
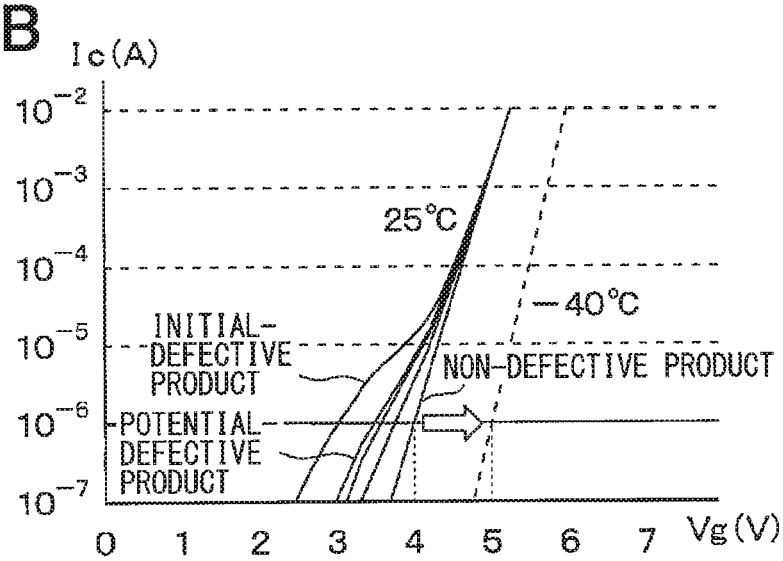
FIG. 5B is a diagram illustrating a change in Vg-Ic characteristic of each of a normal non-defective product, an initially-defective product, and a potentially-defective product at 25 degrees Celsius.
Figure 5C:
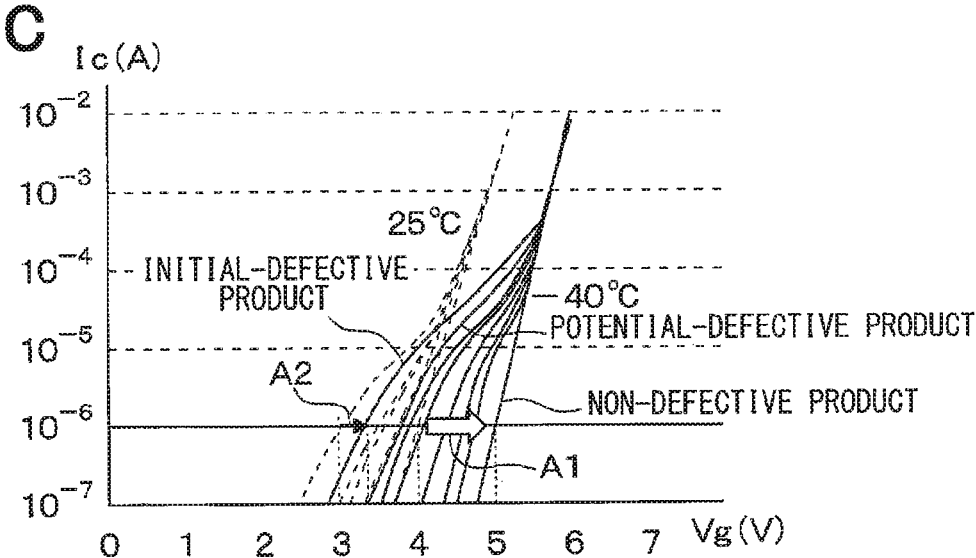
FIG. 5C is a diagram illustrating a change in Vg-Ic characteristic of each of a normal non-defective product, the initially-defective product, and the potentially-defective product at −40 degrees Celsius.

This phenomenon will be described in more detail with reference to FIGS. 5A to 5C in which the vertical axis and horizontal axis of the Vg-Ic characteristic are interchanged. As illustrated in FIG. 5A, although the Vg-Ic characteristics in both the first temperature of 25 degrees Celsius and the second temperature of −40 degrees Celsius are depicted as straight lines, the difference between the both gate voltages Vg is about 1 V as a whole regardless of the value of the collector current Ic. By contrast, as illustrated in FIG. 5B and FIG. 5C, the Vg-Ic characteristics of the potentially-defective product and the initially-defective product are not on the straight lines unlike the normal non-defective product, and are deviated from the straight lines to have the gate voltages Vg smaller in the region of the low collector currents Ic. As described above, when the collector current Ic is small, the Vg-Ic characteristic does not show the straight line characteristic but changes in a nodular manner. This characteristic is based on a leak current flowing via the interface states that have increased due to the distortion of the Si—O—Si bond and is caused by an electrical conduction mechanism different from a normal electrical conduction mechanism, and accordingly, exhibits different temperature coefficients. In this case, the temperature coefficient is smaller than in the normal non-defective product.

When a comparison is made between the case of the first temperature 25 degrees Celsius in FIG. 5B and the case of the second temperature −40 degrees Celsius in FIG. 5C, the decrease in the gate voltage Vg with decreasing collector current Ic at −40 degrees Celsius is greater than that at the 25 degrees Celsius. Accordingly, as illustrated in FIG. 5C, each of the potentially-defective product and the initially-defective has, as shown by the arrow A2, a smaller difference in gate voltages Vg between 25 degrees Celsius illustrated by a broken line and −40 degrees Celsius illustrated by a solid line, than the normal non-defective product has as shown by the arrow A1.

Figure 6:
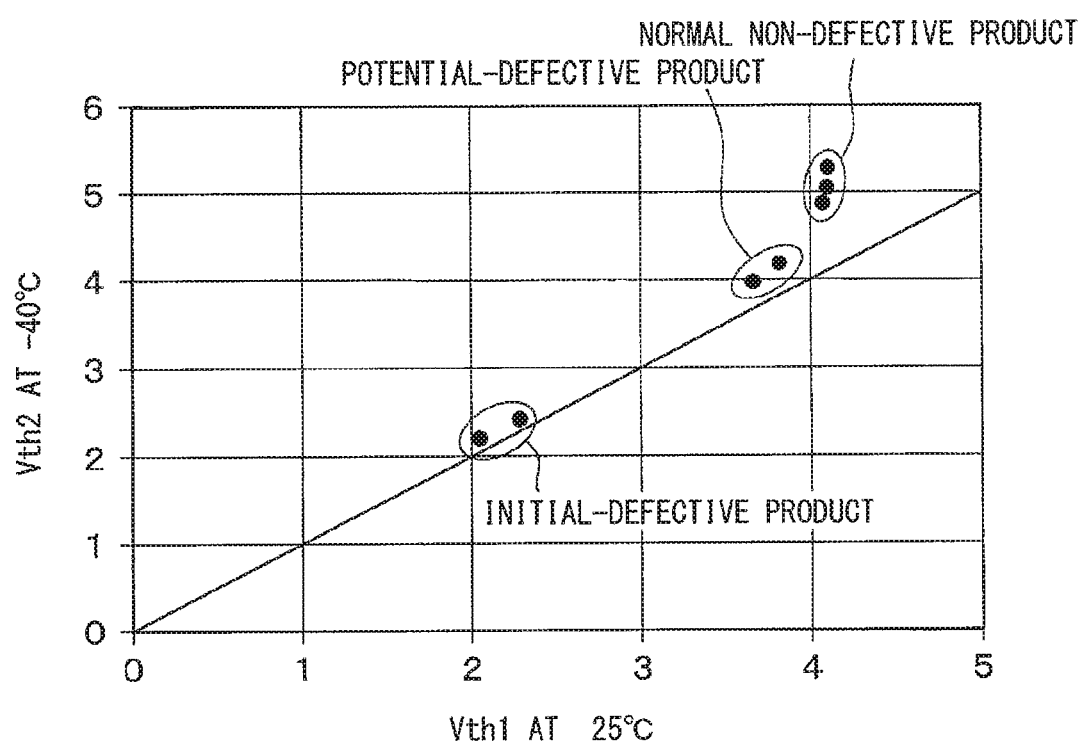
FIG. 6 is a diagram illustrating a relation between a first threshold voltage Vth1 at 25 degrees Celsius and a second threshold voltage Vth2 at −40 degrees Celsius.

FIG. 6 shows a relation between Vth1 obtained at the room temperature and Vth2 obtained at −40 degrees Celsius. Specifically, Vth1 and Vth 2 of the normal non-defective products are deviated from a straight line on which Vth1 and Vth2 satisfy the relation of 1:1, that is, deviated from a temperature-characteristic flat straight line such that Vth2 is larger than Vth1 by about 1V. By contrast, Vth1 and Vth2 of the initially-defective products are positioned approximately on the temperature-characteristic flat straight line. Vth1 and Vth2 of the potentially-defective products are slightly deviated from the temperature-characteristic flat straight line but its deviation degree is smaller than that of the normal non-defective product. The potentially-defective product has Vth1 and Vth2 approximately on the temperature-characteristic flat straight line.

Therefore, when Vth2−Vth1 is calculated, the normal non-defective products satisfy the relation of Vth2−Vth 1≈1V. The potentially-defective product and the initially-defective product satisfy the relation of Vth2−Vth1<1V. In this fashion, the variation in Vth2−Vtht1 occurs when the normal non-defective product is compared with the potentially-defective product and the initially-defective product.

In view of this, in S130, on the basis of the value of Vth2−Vth1, the product is determined as being a normal non-defective product when the relation of Vth2−Vth1≈1V is satisfied. The product is determined as being a potentially-defective product or an initially-defective product when the relation of Vth2−Vth1<1V is satisfied. To be more specific, a value less than 1, e.g., 0.9, is set as a determination threshold value. When the calculated Vth2−Vth1 is larger than the determination threshold value, the product is determined as a normal non-defective product. When the calculated Vth2−Vth1 is less than or equal to the determination threshold value, the product is determined as a defective product or an initially-defective product.

As described above, the inventors of the present disclosure found that the current value of the potentially-defective product has a small temperature dependency in the micro-current region, and made such arrangement in which a non-defective product and a defective product are determined based on the difference between the first threshold voltage Vth1 obtained at the first temperature and the second threshold voltage Vth2 obtained at the second temperature. In this manner, a non-defective product and a defective product are distinguishable by the electrical characteristic inspection, and furthermore, not only initially-defective products but also potentially-defective products are extractable and are prevented from being shipped.

Figure 7A:
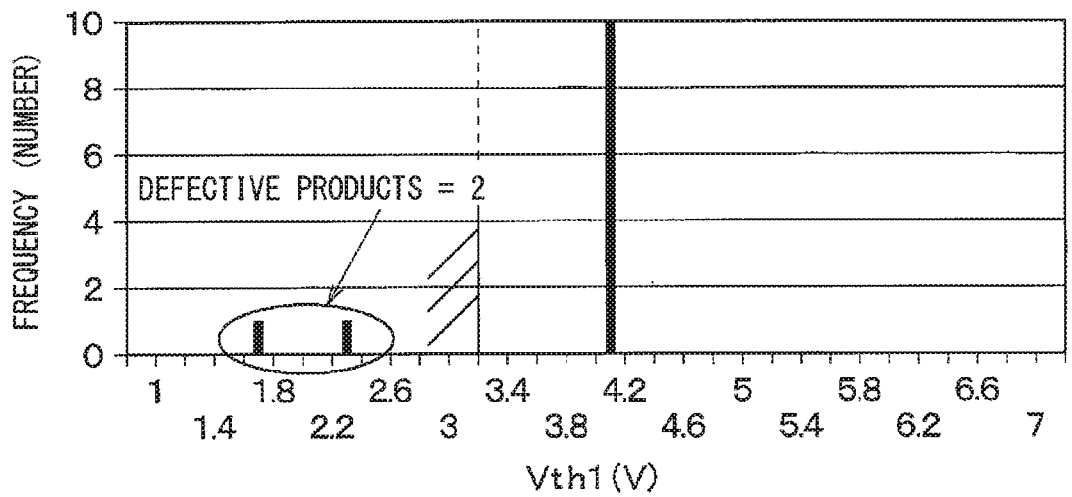
FIG. 7A is a diagram illustrating a relation between values of Vth1 and frequency when the Vg-Ic characteristic is measured under a first temperature for a plurality of chips to measure the first threshold voltage Vth1.

For example, as illustrated in FIG. 7A, in cases where the room temperature is adopted as the first temperature, when the first threshold voltage Vth1 of the IGBT of each chip was examined under the condition of the collector current Ic of 500 nA, the first threshold voltages Vth1 of many of the elements concentrated at 4.2 V for example. As to initially-defective products, their first threshold voltages Vth1 were 1.8 V and 2.2 V. In this case, when the standard value is set to, for example, 3.2 V, initially-defective products are extractable. A potentially-defective product has, however, the first threshold voltage Vth1 of 4.2 V like the normal non-defective product. As a result, even when the standard value is set, the potentially-defective product is undetectable.

Figure 7B:
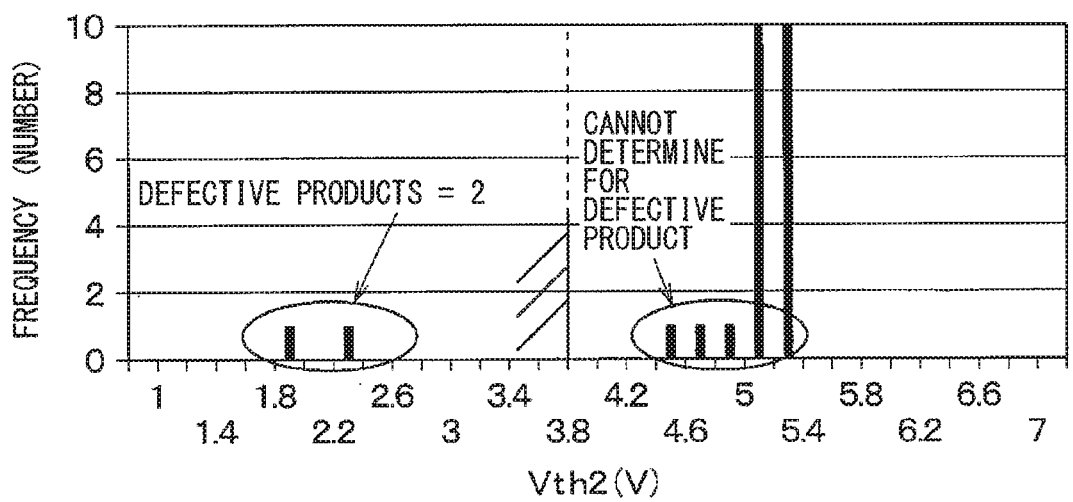
FIG. 7B is a diagram illustrating a relation between values of Vth2 and frequency when the Vg-Ic characteristic is measured under a second temperature for a plurality of chips to measure the second threshold voltage Vth2.

Additionally, as illustrated in FIG. 7B, in cases where −40 degrees Celsius is adopted as the second temperature, when the second threshold voltage Vth2 of the IGBT of each chip is examined under the condition of the collector current Ic of 500 nA, the second threshold voltages Vth2 of many of elements concentrated at 5.0 V to 5.2 V for example. As to initially-defective products, their second threshold voltages Vth were 1.8 V and 2.2 V. As to potentially-defective products, although their second threshold voltages Vth2 were 4.4 V to 4.8 V, which are slightly smaller than those of normal non-defective products, difference from those of normal non-defective products was small. In this case, when the standard value is set, the standard value needs to be set to a value that does not exclude normal non-defective products. Thus, the standard value is set to, for example, about 3.8 V in consideration of margin to some extents. However, in this case also, although initially-defective products are extractable, the potentially-defective products are undetectable because the second threshold voltage Vth2 is larger than 3.8 V.

Therefore, merely examining the first threshold voltage Vth1 at the first temperature and comparing it with the standard value, or, merely examining the second threshold voltage Vth2 at the second temperature and comparing it with the standard value are not enough to detect potentially-defective products although initially-defective products are detectable.

Figure 7C:
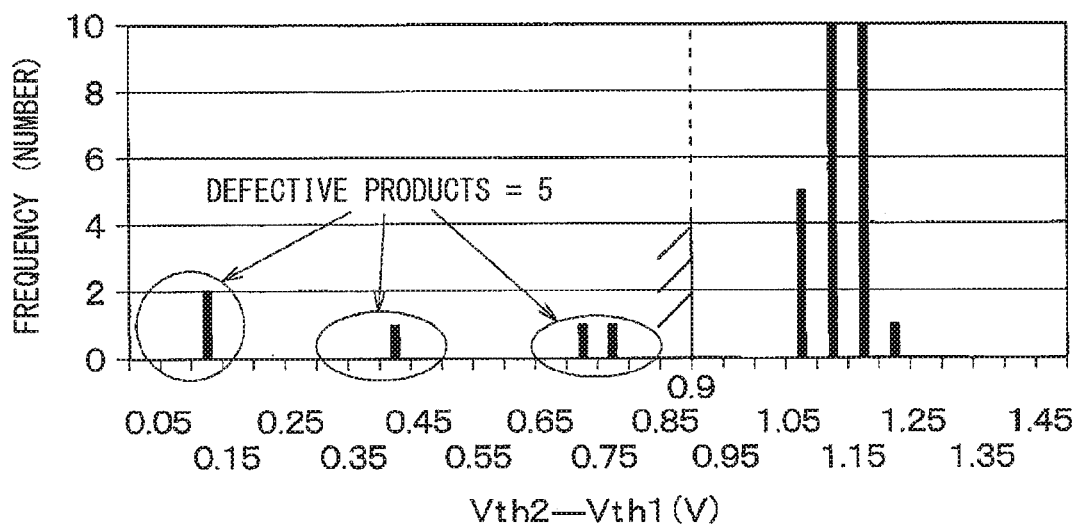
FIG. 7C is a diagram illustrating a relation between Vth2−Vth1 and frequency for a plurality of chips.

By contrast, as illustrated in FIG. 7C, when the difference Vth2−Vth1 between the second threshold voltage Vth2 and the first threshold voltage Vth1 was examined, the difference concentrated at from 1.05 V to 1.25 V in a number of the elements, for example. The differences were 0.15 V, 0.45 V, 0.75 V, and 0.8 V in some elements. Among the elements, the elements having the differences of 1.05 V to 1.25 V were normal non-defective products, the elements having the difference of 0.15 V were initially-defective products, and the elements having the differences of 0.45 V, 0.75 V, and 0.8 V were potentially-defective products. In this case, when the determination threshold value for Vth2−Vth1 is set to, for example, 0.9 V, not only initially-defective products but also potentially-defective products are detectable. Although this determination threshold value is set in consideration of margin, because a difference between a value of the normal non-defective product and a value of the potentially-defective product is large, potentially-defective products are accurately detectable even when the margin is incorporated. Note that, in FIGS. 7A to 7C, the frequency denotes the number of cases inspected.

Second Embodiment

A second embodiment will be described. The second embodiment is a modification of the first embodiment in the trench gate structure and is similar to the first embodiment in other points, and thus, a difference from the first embodiment will be described.

Figure 8:
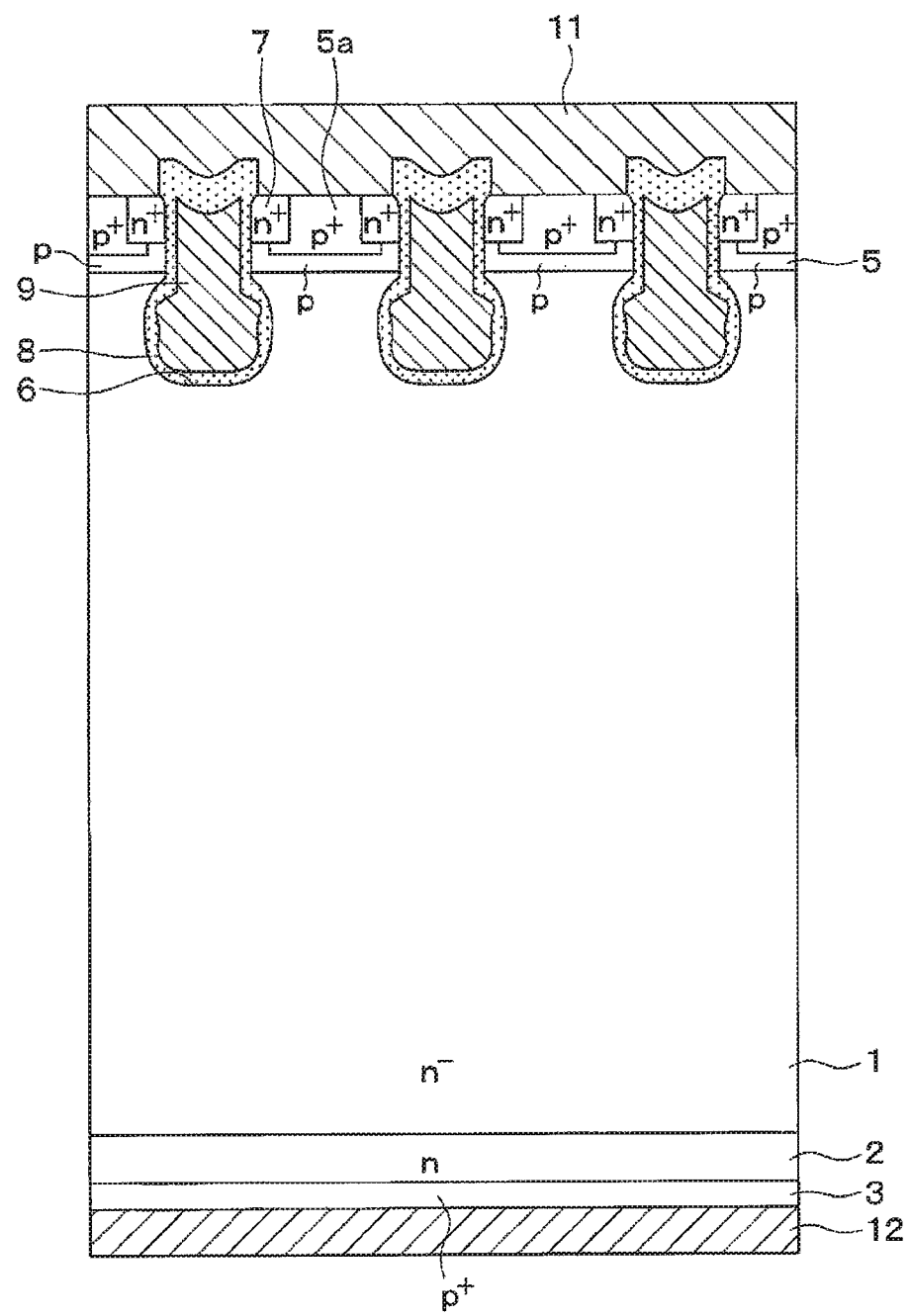
FIG. 8 is a cross-sectional view illustrating a structure of a semiconductor device manufactured by a manufacturing method of a second embodiment.

As illustrated in FIG. 8, a width of the bottom of the trench 6 in the trench gate structure is wider than a width of the open end of the trench 6. In cases where the bottom of the trench 6 is wide, when its manufacturing processes include the inspection process similar to that in the first embodiment, potentially-defective products are properly detectable.

Figure 9:
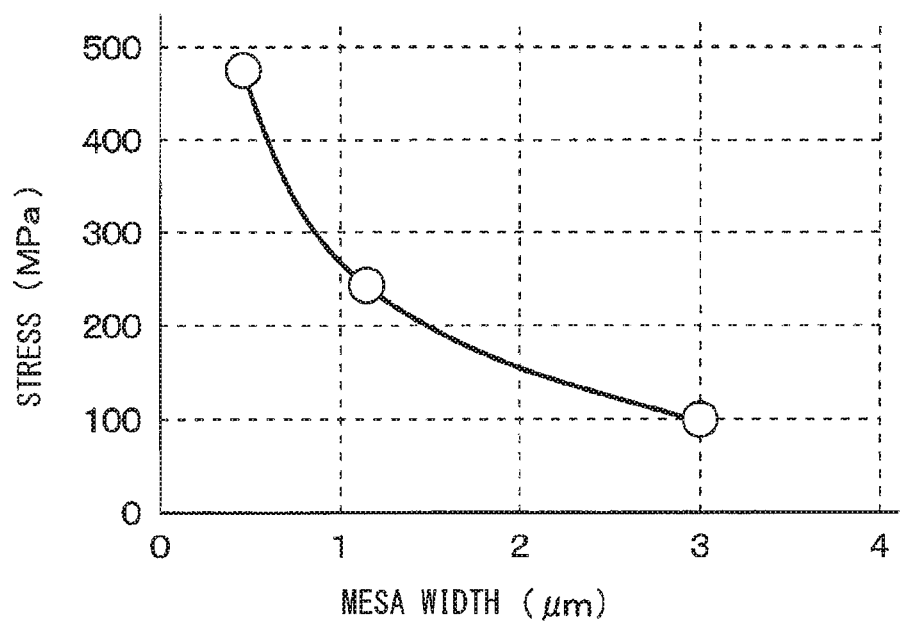
FIG. 9 is a diagram illustrating a relation between mesa width and stress.

In the case of the trench gate structure illustrated in FIG. 8 in particular, the distance between the trench gate structures at the bottoms of the trenches 6, that is, a mesa width, becomes narrow by a length corresponding to a widened width of the bottoms of the trenches 6. For example, the mesa width becomes 1 μm or less, e.g., about 0.5 μm. The stress generated around the trench gate structure due to manufacturing process tends to increase as the mesa width becomes narrow. As a result, when the mesa width is narrow as in the present embodiment, the stress is large. Specifically, the relation between the mesa width and the stress is obtained as a relation illustrated in FIG. 9. When the mesa width is less than or equal to 1.5 μm, a large stress of 200 MPa or more is generated, and thus, there is a high possibility that a potentially-defective product actually becomes a defective product during usage and therefore it may be preferable to perform the above-described inspection process. In particular, when the mesa width is less than or equal to 1.0 μm, specifically 0.5 μm as in the present embodiment, because the stress is 400 MPa or more, it may be preferable to perform the above-described inspection process.

As described above, when the inspection process is performed to the semiconductor device having a wide bottom of the trench 6 of the trench gate structure and having a narrow mesa width, a potentially-defective product having a high possibility of becoming a defective product during usage is excludable.

Other Embodiments

Although the present disclosure has been described in accordance with the example embodiments, the disclosure is not limited to the embodiments. The present disclosure covers various modification examples and modifications within equivalent scopes. Furthermore, various combinations and modes, and other combinations and modes including more, less, or only a single element also fall within the scope and the spirit of the present disclosure.

(1) In the trench gate structure illustrated in the first embodiment, the side surface of the trench 6 is perpendicular to the surface of the semiconductor substrate, and the side surface of the gate electrode 9 is flat along the side surface of the trench 6. In the illustration of the second embodiment, the bottom of the trench 6 is wide and the open end of the trench 6 is narrower than the bottom.

Figure 10:
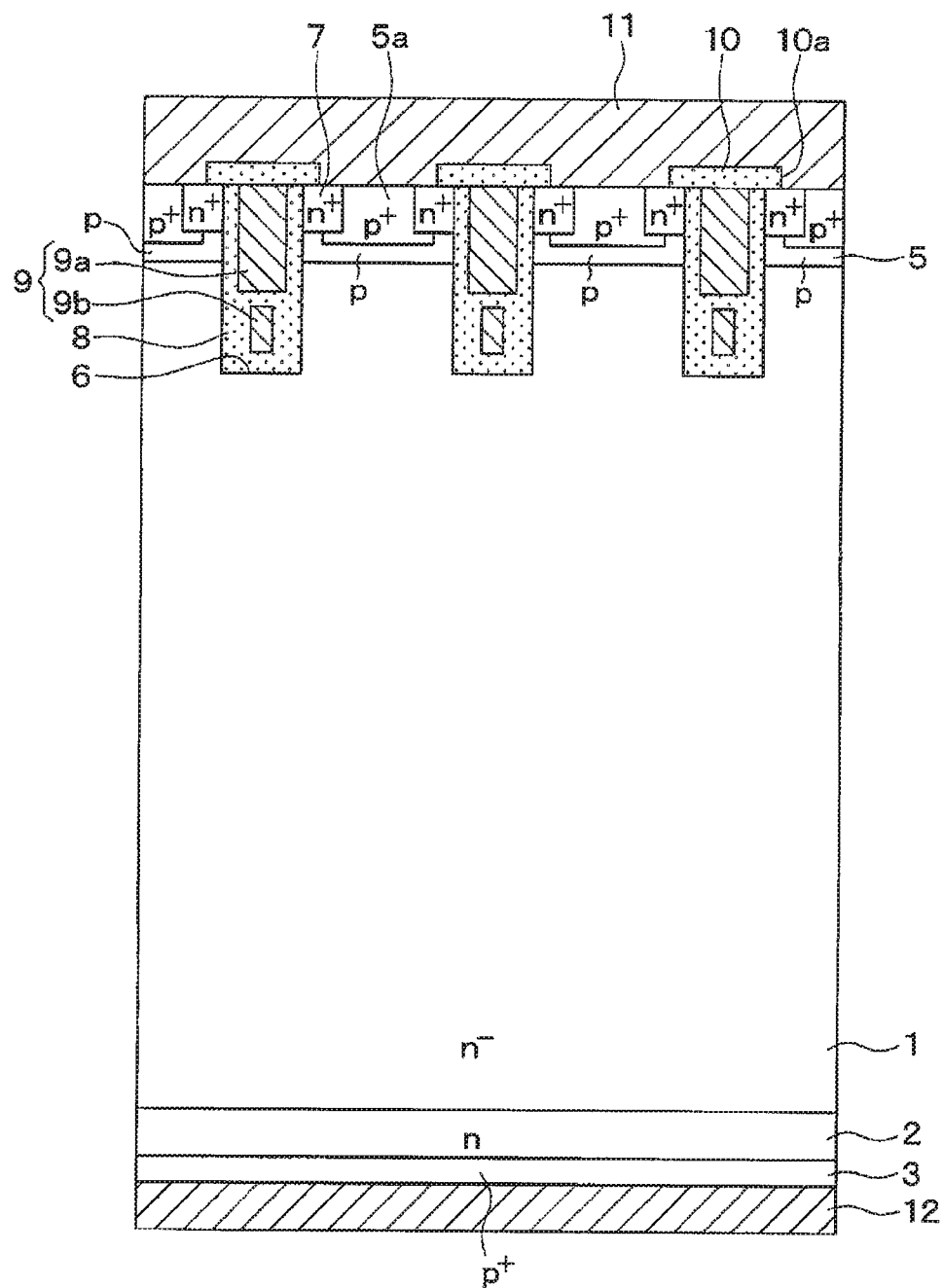
FIG. 10 is a cross-sectional view illustrating a structure of a semiconductor device of another embodiment.
Figure 11:
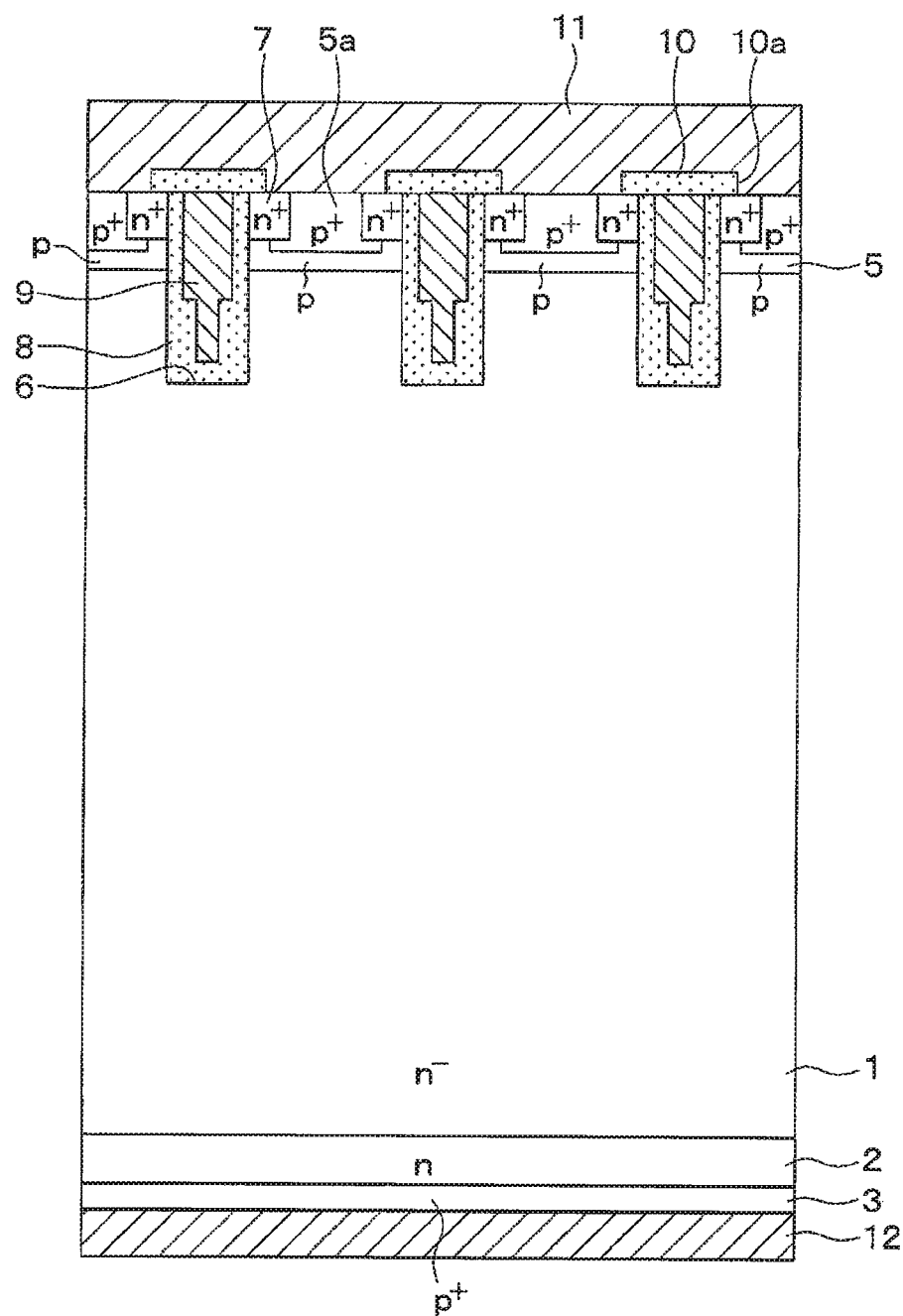
FIG. 11 is a cross-sectional view illustrating a semiconductor device of yet another embodiment.

However, the trench gate structure is not limited to these structures. For example, as illustrated in FIG. 10, the gate electrode 9 may have a two-layered gate structure including a first gate electrode 9a and a second gate electrode 9b. The first gate electrode 9a may be for channel formation. The second gate electrode 9b may be located between the bottom of the trench and the first gate electrode 9a and may have a source electric potential. Furthermore, as illustrated in FIG. 11, even when the gate electrode 9 has a one-layer gate structure, there may be a structure in which the width of the gate electrode 9 at a location close to the bottom of the trench 6 is narrower than the width of the gate electrode 9 at a location close to the open end of the trench 6 and the gate insulating film 8 is thick accordingly. The stress generated is prone to be large, in particular, in the structure where the gate insulating film 8 is thick on the bottom of the trench 6. Therefore, it may be preferable to perform the above-described inspection processes to the devices having the structure illustrated in the second embodiment and the structures illustrated in FIG. 10 and FIG. 11, in order to exclude the potentially-defective product having high possibility of becoming a defective product during usage.

(2) In the above embodiments, the IGBT having an inverting type trench gate structure of n-channel type is illustrated as an example of power semiconductor element. However, each of the above embodiments merely shows an example of the power semiconductor element having a trench gate structure. The power semiconductor element may have another structure or may be of another conductivity type.

For example, in the first embodiment and the like, the IGBT of n-channel type in which the first conductivity type is n-type and the second conductivity type is p-type is illustrated by way of example. Alternatively, a p-channel type IGBT in which the conductivity type of each element is inverted may be employed. In the above, although the IGBT is illustrated as the power semiconductor element, the present disclosure is applicable also to a MOSFET having a similar structure. To obtain the MOSFET, a $p^+$-type impurity layer providing the collector region 3 in each of the above embodiments is replaced with an $n^+$-type impurity layer by changing the conductivity type from p-type to n-type, while other structures and the manufacturing method are the same as those in each of the above embodiments. Note that, in the case of the MOSFET, the microcurrent region refers to a current region of the current less than or equal to a threshold value of the MOSFET.

(3) In the above embodiments, the first temperature is a room temperature, e.g., 25 degrees Celsius, and the second temperature is lower than the first temperature and is below the freezing point of water, e.g., −40 degrees Celsius. However, this is merely an example. The first temperature may be set low and the second temperature may be set higher than the first temperature.

The first temperature and the second temperature can be set to any intended values. However, it may be preferable to set the first temperature and the second temperature such that in the region where the collector current Ic is small in Vg-Ic characteristic, the gate voltage Vg is slightly deviated from the straight line to have a deviation amount to some extents and a difference in deviation amount between the first and second temperatures is large. For example, when the second temperature is set below the freezing point of water, more preferably, to a temperature of −30 degrees Celsius or less, the amount of deviation of the gate voltage Vg from the straight line toward the smaller value is large in the region where the collector current Ic is small in the Vg-Ic characteristic. This temperature setting facilitates an increases in the difference of deviation amounts between the first temperature and the second temperature and may be more preferable.

What is claimed is:

1. A method for manufacturing a semiconductor device, the semiconductor device including
a drift layer of a first conductivity type having a first surface and a second surface opposite to each other,
a channel layer of a second conductivity type formed on a first surface side of the drift layer,
a first conductivity type layer formed above the channel layer,
a trench gate structure in which a gate electrode is disposed in a trench with a gate insulating film, wherein the trench penetrates the first conductivity type layer and the channel layer and reaches the drift layer,
a first electrode electrically connected to the first conductivity type layer, and
a second electrode provided on a second surface side of the drift layer, wherein
a main current flows between the first electrode and the second electrode when a gate voltage is applied to the gate electrode,
the method comprising:
measuring a first voltage-current characteristic indicating a relation between the main current and the gate voltage under a first temperature;
calculating a first threshold voltage based on the first voltage-current characteristic, wherein the gate voltage when the main current has a predetermined value in a microcurrent region is calculated as the first threshold voltage;
measuring a second voltage-current characteristic indicating a relation between the main current and the gate voltage under a second temperature different from the first temperature;
calculating a second threshold voltage based on the second voltage-current characteristic, wherein the gate voltage when the main current has a pre-given value in the microcurrent region is calculated as the second threshold voltage;
determining that the semiconductor device is a non-defective product when a difference between the second threshold voltage and the first threshold voltage is larger than a determination threshold value; and determining that the semiconductor device is a defective product when the difference is equal to or smaller than the determination threshold value.

2. The method according to claim 1, wherein the method is applied to the semiconductor device having the trench gate structure in which a bottom of the trench is wider than an open end of the trench.

3. The method according to claim 1, wherein the method is applied to the semiconductor device having the trench gate structure in which a plurality of the trenches are arrange at pitches of 1.5 μm or less.

4. The method according to claim 1, wherein the method is applied to the semiconductor device having the trench gate structure in which a plurality of the trenches are arrange at pitches of 1.0 μm or less.

5. The method according to claim 1, wherein measuring the first voltage-current characteristic under the first temperature incudes measuring the first voltage-current characteristic under a room temperature.

6. The method according to claim 1 wherein measuring the second voltage-current characteristic under the second temperature includes measuring the second voltage-current characteristic under a temperature below a freezing point of water.

7. The method according to claim 6, wherein the temperature below the freezing point of water, under which the second voltage-current characteristic is measured, is less than or equal to −30 degrees Celsius.

* * * * *